United States Patent
Mclellan et al.

(10) Patent No.: US 8,785,317 B2
(45) Date of Patent: Jul. 22, 2014

(54) WAFER LEVEL PACKAGING OF SEMICONDUCTOR CHIPS

(71) Applicant: ATI Technologies ULC, Markham (CA)

(72) Inventors: Neil Mclellan, Toronto (CA); Adam Zbrzezny, Scarborough (CA)

(73) Assignee: ATI Technologies ULC, Markham, Ontario (CA)

( * ) Notice: Subject to any disclaimer, the term of this patent is extended or adjusted under 35 U.S.C. 154(b) by 0 days.

(21) Appl. No.: 13/690,838

(22) Filed: Nov. 30, 2012

(65) Prior Publication Data
US 2013/0095614 A1 Apr. 18, 2013

Related U.S. Application Data

(62) Division of application No. 11/847,101, filed on Aug. 29, 2007, now Pat. No. 8,344,505.

(51) Int. Cl.
*H01L 21/44* (2006.01)
*H01L 23/00* (2006.01)

(52) U.S. Cl.
CPC ....... *H01L 24/11* (2013.01); *H01L 2924/01029* (2013.01); *H01L 2224/13099* (2013.01); *H01L 2924/01079* (2013.01); *H01L 2924/14* (2013.01)
USPC .......................................... 438/613; 257/737

(58) Field of Classification Search
CPC ........... H01L 2224/13099; H01L 2924/01029; H01L 24/11; H01L 2924/01079; H01L 2924/14
USPC .......................................... 438/613; 257/737
See application file for complete search history.

(56) References Cited

U.S. PATENT DOCUMENTS

| | | | |
|---|---|---|---|
| 3,871,014 A | 3/1975 | King et al. | |
| 4,016,463 A | 4/1977 | Beall et al. | |
| 5,194,137 A | 3/1993 | Moore et al. | |
| 5,569,960 A | 10/1996 | Kumazawa et al. | |
| 6,107,685 A | 8/2000 | Nishiyama | |
| 6,124,637 A | 9/2000 | Freyman et al. | |
| 6,284,569 B1 | 9/2001 | Sheppard et al. | |
| 6,444,563 B1 | 9/2002 | Potter et al. | |
| 6,452,270 B1 | 9/2002 | Huang | |
| 6,657,137 B2 * | 12/2003 | Miyake et al. | 174/527 |
| 6,780,733 B2 | 8/2004 | Chason et al. | |
| 6,825,568 B2 | 11/2004 | Hung | |
| 6,927,491 B1 | 8/2005 | Yamada | |
| 6,940,176 B2 | 9/2005 | Chen | |

(Continued)

OTHER PUBLICATIONS

Qi, Guojun et al., "Zincating morphology of aluminum bond pad: its influence on quality of electroless nickel bumping", Thin Solid Films, 2002, pp. 219-223, vol. 406, Elsevier Science B.V.

(Continued)

*Primary Examiner* — Anthony Ho
(74) *Attorney, Agent, or Firm* — Faegre Baker Daniels LLP

(57) ABSTRACT

A method of manufacturing semiconductor packages at the wafer level is disclosed. A wafer has multiple integrated circuits (ICs) formed on its active surface, with each IC in communication with a plurality under-bump metallization (UBM) pads formed on one surface the package. The UBM pads include a larger pads near the center of package and smaller UBM pads near the periphery. The method includes attaching a stiffener to an inactive surface of the wafer; forming under bump metallization pads; and forming solder bumps extending from the UBM pads.

11 Claims, 9 Drawing Sheets

(56) References Cited

U.S. PATENT DOCUMENTS

| | | | |
|---|---|---|---|
| 2002/0071935 A1* | 6/2002 | Wu | 428/134 |
| 2002/0090805 A1* | 7/2002 | Yap et al. | 438/615 |
| 2003/0080392 A1 | 5/2003 | Zuniga-Ortiz et al. | |
| 2004/0092092 A1 | 5/2004 | Yang | |
| 2004/0106291 A1* | 6/2004 | Ho et al. | 438/689 |

OTHER PUBLICATIONS

Holder, Helen, "Introduction to surface mount technology", Apr. 24, 2002. Accessed: Nov. 12, 2007. Available online: <http://www-bsac.eecs.berkeley.edu/forus/intro_to_SMT.ppt>.

Jiang, Fang-Xing, USPTO Communication, dated Aug. 30, 2012, in related U.S. Appl. No. 11/847,101, filed Aug. 29, 2007.

Jiang, Fang-Xing, USPTO Communication, dated Nov. 17, 2011, in related U.S. Appl. No. 11/847,101, filed Aug. 29, 2007.

Jiang, Fang-Xing, USPTO Communication, dated May 11, 2011, in related U.S. Appl. No. 11/847,101, filed Aug. 29, 2007.

Jiang, Fang-Xing, USPTO Communication, dated Jul. 20, 2010, in related U.S. Appl. No. 11/847,101, filed Aug. 29, 2007.

Jiang, Fang-Xing, USPTO Communication, dated Dec. 11, 2009, in related U.S. Appl. No. 11/847,101, filed Aug. 29, 2007.

* cited by examiner

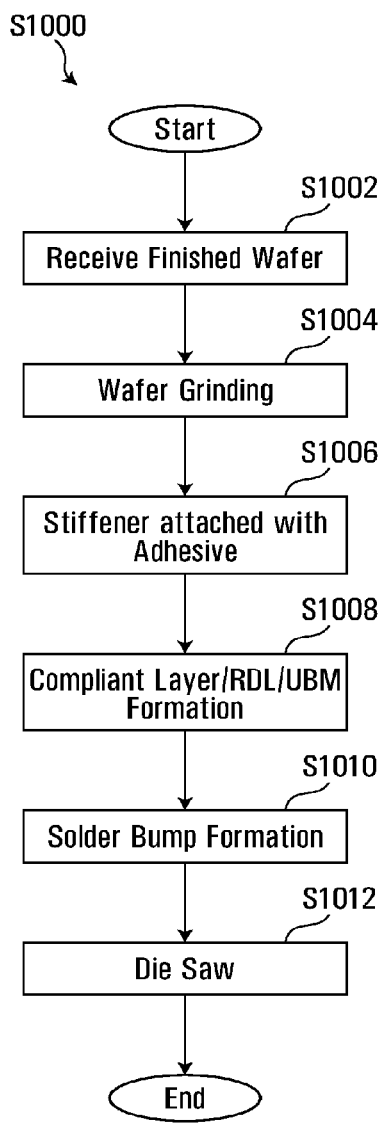
FIG. 10
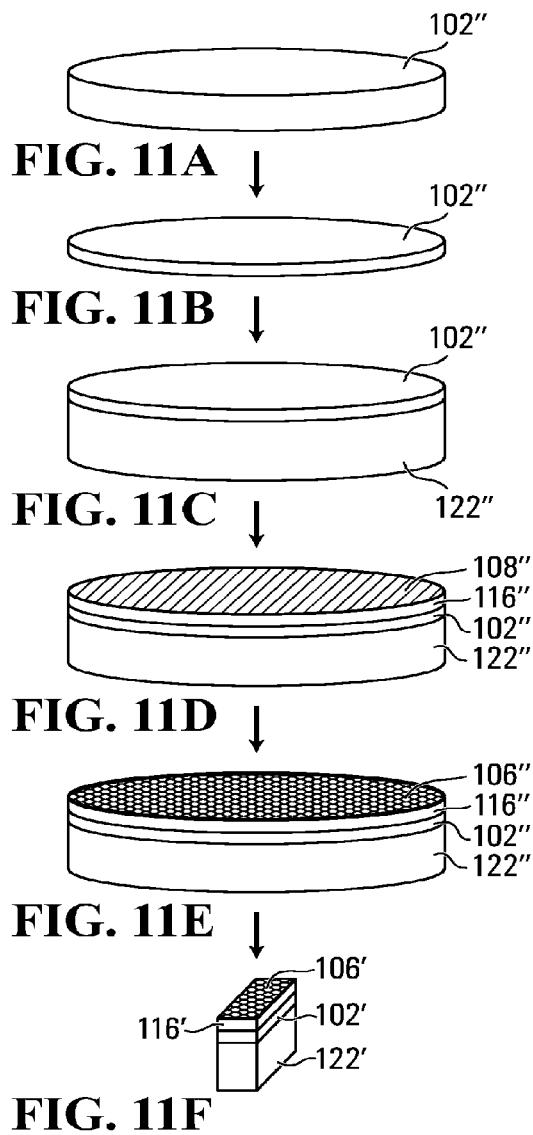
FIG. 11A
FIG. 11B
FIG. 11C
FIG. 11D
FIG. 11E
FIG. 11F

WAFER LEVEL PACKAGING OF SEMICONDUCTOR CHIPS

RELATED CO-PENDING APPLICATIONS

This application is a divisional of U.S. patent application Ser. No. 11/847,101 filed Aug. 29, 2007, titled "WAFER LEVEL PACKAGING OF SEMICONDUCTOR CHIPS", having inventors Neil Mclellan et al., the contents of which are hereby incorporated by reference.

FIELD OF THE INVENTION

The present invention relates generally to semiconductor chip packaging and more particularly to wafer level packaging of semiconductor chips.

BACKGROUND OF THE INVENTION

Integrated circuits are formed on a semiconductor die and packaged for incorporation into a variety of end products. Examples of semiconductor chip packages include general purpose processors, graphics processing units, memory chips and a variety of specialized application specific integrated circuits (ASIC).

Packaging integrated circuits typically entails placing a die on a carrier such as substrate, a lead-frame or a circuit board and forming electrical connections between interface pads on the die and conductive traces on the carrier. The carrier includes solder balls or pins which are suitable for mounting the package on external devices such as motherboards, expansion cards, and the like. The conductive traces provide electrical interconnection to solder balls or pins on the carrier.

A variety of packaging techniques are commonly used. These include flip chip packaging and wire bonding. In wire bonding, the inactive surface of the die, away from the circuitry, is attached to a carrier, and wires are bonded to die pads on the die on one end, and to conductive traces on the carrier substrate at the other end of the wire.

In flip chip packaging however, the active surface of the die faces the carrier substrate when the die is attached. Small amounts of solder called solder bumps are formed on each die pad of the die and used to connect each die pad on the die to a corresponding conductive trace on the carrier. Under bump metallization (UBM) is typically formed over each pad, to provide a low resistance electrical connection to solder bumps. Each conductive trace connects to a corresponding solder ball to provide external I/O connection points. The solder balls are used to attach the semiconductor package to an external printed circuit board (PCB).

Flip-chip packaging is generally regarded as providing smaller package sizes, higher performance, greater input/output (I/O) density and lower cost as compared to wire-bonding.

Semiconductor packaging may be performed per each die, or at the wafer level. In wafer level packaging, instead of applying packaging techniques to individual dies, packaging techniques are applied to all the dies on a fabricated wafer at once. As a last step, the wafer is separated or cut into individual packaged dies ready for assembly onto an external board. Flip chip packaging techniques can be applied at the wafer level to form individual semiconductor packages.

Solder bumps may be subjected to thermo-mechanical stress. A common source of thermo-mechanical stress is a mismatch in the coefficient of thermal expansion (CTE) between the die and the carrier. During operation, heat is invariably generated by integrated circuits, which causes both the die and the carrier to expand. As the CTE for the die may be substantially different from the CTE of the carrier, this dissimilar rate of expansion causes thermo-mechanical stress on the solder bumps. If the stress is sufficiently large, it may damage the physical connection provided by solder bumps and as a result electrical connectivity may be lost.

One well known technique to reduce thermo-mechanical stress in flip-chip attachments is underfilling, which entails introducing additional material (called underfill) such as epoxy resin between the die and the carrier after the die is attached onto the carrier board. This reduces the stress on the solder bumps, thereby improving the package's reliability.

However, underfilling is disadvantageous as it entails an additional manufacturing step and makes disassembly of semiconductor packages difficult.

Accordingly, there is a need for new chip packaging techniques.

SUMMARY OF THE INVENTION

In accordance with one aspect of the present invention, there is provided a method of manufacturing a semiconductor package from a wafer. The wafer has at least one integrated circuit (IC) formed on its active surface. The method includes attaching a stiffener to an inactive surface of the wafer; and forming a substantially rectangular under bump metallization (UBM) pads. Each one of the UBM pads is in communication with the IC. The UBM pads include at least a first UBM pad, and a second UBM pad larger than the first UBM pad. The method also includes forming solder bumps extending from each of the UBM pads; and separating the wafer into semiconductor packages.

In accordance with another aspect of the present invention, there is provided, a semiconductor package including a die having an inactive side and an active side with an integrated circuit (IC) formed on it; a stiffener attached to the inactive side of the die; and a plurality of UBM pads formed on one surface of the package. The UBM pads are in electrical communication with the IC. The UBM pads include at least a first pad placed near a center of the surface, and a second pad smaller than the first pad, placed near a periphery of the surface. The package also includes plurality solder bumps formed on the UBM pads.

In accordance with yet another aspect of the present invention, there is provided a semiconductor chip package including a die with an integrated circuit (IC) formed proximate an active surface; a stiffener attached to an inactive surface of the die; and a plurality of substantially rectangular under-bump metallization (UBM) pads in communication with the IC. The UBM pads include at least a first pad and a second pad larger than the first pad. The package also includes solder bumps extending from each of the pads.

Other aspects and features of the present invention will become apparent to those of ordinary skill in the art upon review of the following description of specific embodiments of the invention in conjunction with the accompanying figures.

BRIEF DESCRIPTION OF THE DRAWINGS

In the figures which illustrate by way of example only, embodiments of the present invention.

FIG. 10 is a flow chart depicting steps involved in manufacturing the semiconductor chip package of FIG. 3 starting with a wafer; and FIGS. 11A-11F are schematic diagrams of a partially processed wafer level semiconductor package resulting from the steps depicted in FIG. 10.

DETAILED DESCRIPTION

Figure 1:
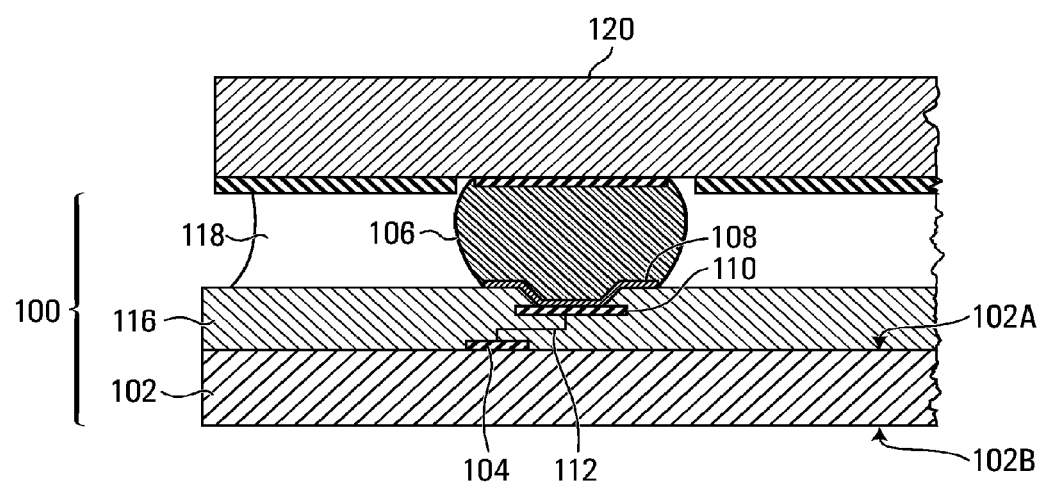
FIG. 1 is a cross sectional view of a conventional semiconductor chip package.

FIG. 1 depicts a conventional semiconductor chip package 100 which includes a die 102 with an active surface 102A and an inactive surface 102B. Die 102 has an integrated circuit formed on its active surface 102A. Die pads 104 formed also on active surface 102A of die 102 provide input-output (I/O) interface to the integrated circuit.

Semiconductor chip package 100 may be a conventional wafer level package (WLP) formed using a conventional wafer level package fabrication method. Wafer level packages are integrated circuit packages packaged at least in part, in wafer form, and thereafter separated into dies. Wafer level packages are typically chip-scale packages (CSP), and provide advantages lowered production cost.

Popular WLP packages such as semiconductor chip package 100 include a redistribution layer (RDL) and a compliant layer 116 which includes one or more layers of dielectric material. A metal routing 112, such as thin-film metal, is used to redistribute pad locations by interconnecting die pads 104 to redistributed input-output (I/O) pads 110. Metal routing 112 may be deposited using standard photolithography and thin film deposition techniques. Compliant layer 116 increases the stress compliance of under-bump metallization (UBM) pads 108 and solder bumps 106 formed thereon.

An under-bump metallization (UBM) pad 108 is formed on each of I/O pads 110. UBM pads 108 provide a low resistance electrical connection between I/O pads 110 and solder bumps 106. Solder bumps 106 in turn connect die 102 to a board 120 which may be a carrier substrate, or an application printed circuit board. When chip package 100 is attached to board 120, solder bumps 106 thus provide both the mechanical and electrical connection.

Figure 2:
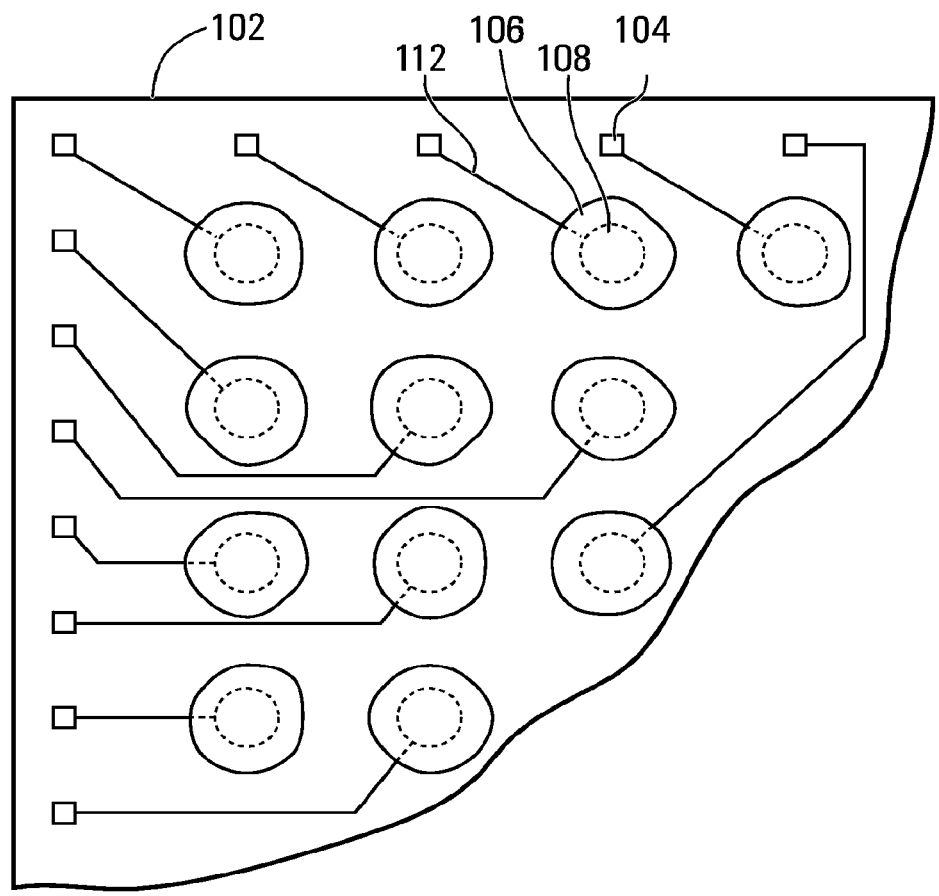
FIG. 2 is a partial plan view of the conventional semiconductor chip package of FIG. 1.

As shown in FIG. 2, UBM pads 108 can be arranged evenly over one surface of chip package 100 to allow a coarser pitch than fine pitched die pads 104 on the periphery of die 102. UBM pads 108 are typically circular pads. In addition, UBM pads 108 are uniform—that is, each UBM pad 108 is of approximately the same size. Consequently, solder bumps 106 are also uniform in volume. In addition the surface areas of direct contact between corresponding UBM pads 108 and solder bumps 106 are also uniform in size.

During operation, semiconductor chip package 100 consumes energy supplied in the form of a voltage input and dissipates some of it in the form of heat. Unfortunately, the generated heat causes both die 102 and board 120 to expand at their respective coefficients of thermal expansion (CTE). As the CTE for die 102 may be substantially different from the CTE of board 120, the resulting expansion often causes thermo-mechanical stress on the solder bumps 106.

The thermo-mechanical stress may cause some of solder bumps 106 to crack prematurely or become disconnected altogether. As a result electrical connectivity between die 102 and board 120 may be unreliable or sometimes completely lost. This is highly undesirable as it decreases the overall reliability of semiconductor chip package 100 and may even render it inoperable.

Moreover, thermo-mechanical stress caused by CTE mismatches, increases in proportion to the size of die 102. The larger the size of die 102, the greater the thermo-mechanical stress experienced by solder bumps 106. As a result, the size of conventional wafer level packages, like chip package 100 is typically limited to about 5×5 mm.

To mitigate the effects of CTE mismatches, conventional fabrication techniques often introduce an underfill 118 in the form of an encapsulant, or epoxy resin that is dispensed between package 100 and board 120 such that the gap between die 102 and board 120 is completely filled. Unfortunately, this adds an extra step (and hence cost) to the manufacturing process. Moreover, underfill 118 makes any future disassembly of chip package 100 from board 120 difficult.

Figure 3:
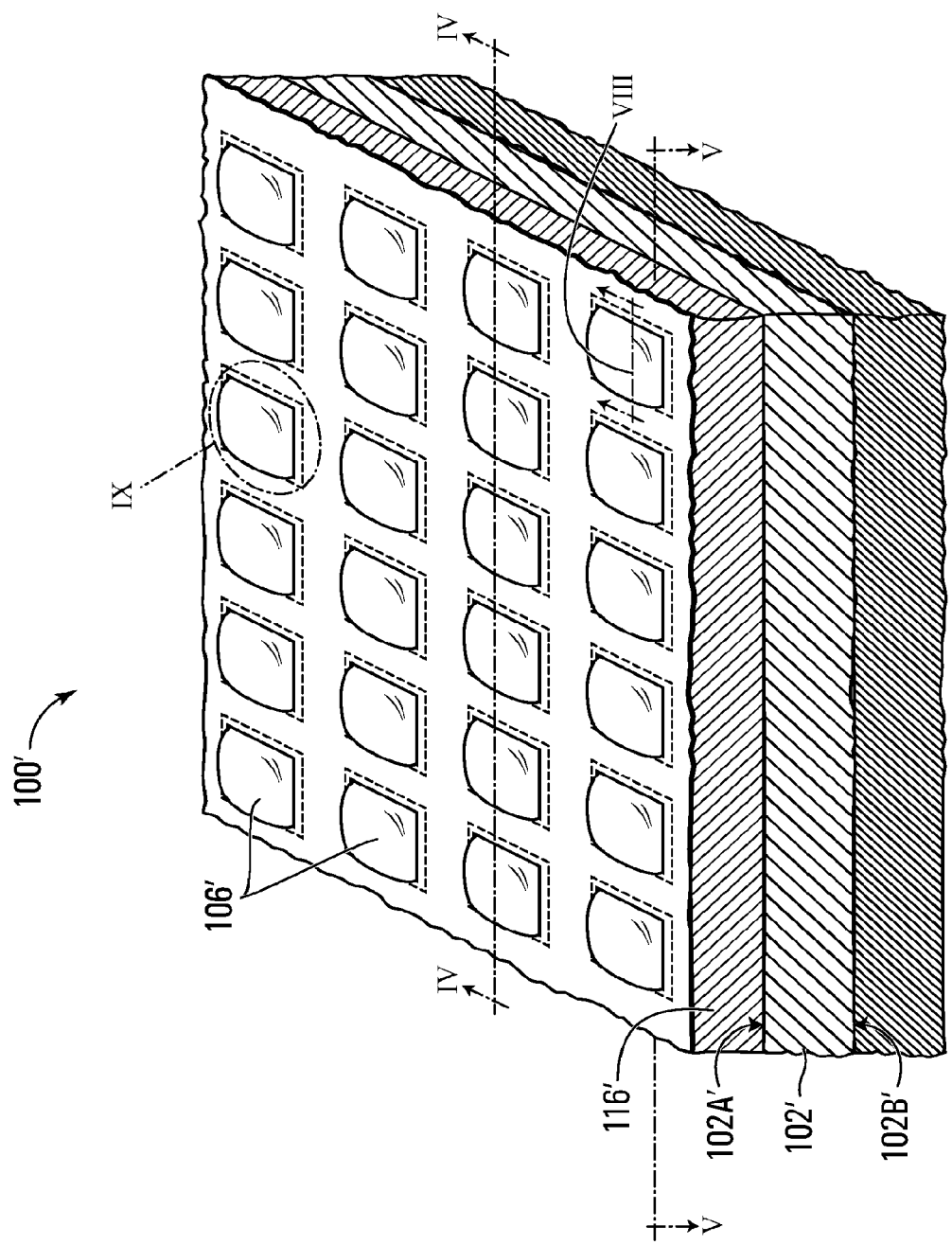
FIG. 3 is a perspective view of a semiconductor chip package exemplary of an embodiment of the present invention.

Accordingly, a semiconductor chip package 100', exemplary of an embodiment of the present invention, is depicted in FIG. 3. Like parts in FIG. 1 and FIG. 3 are labeled with like numerals—using a prime symbol (') to distinguish parts shown in FIG. 3 from their counterparts in FIG. 1. A cross-sectional view of the same semiconductor package 100' is depicted in FIG. 4.

Figure 4:
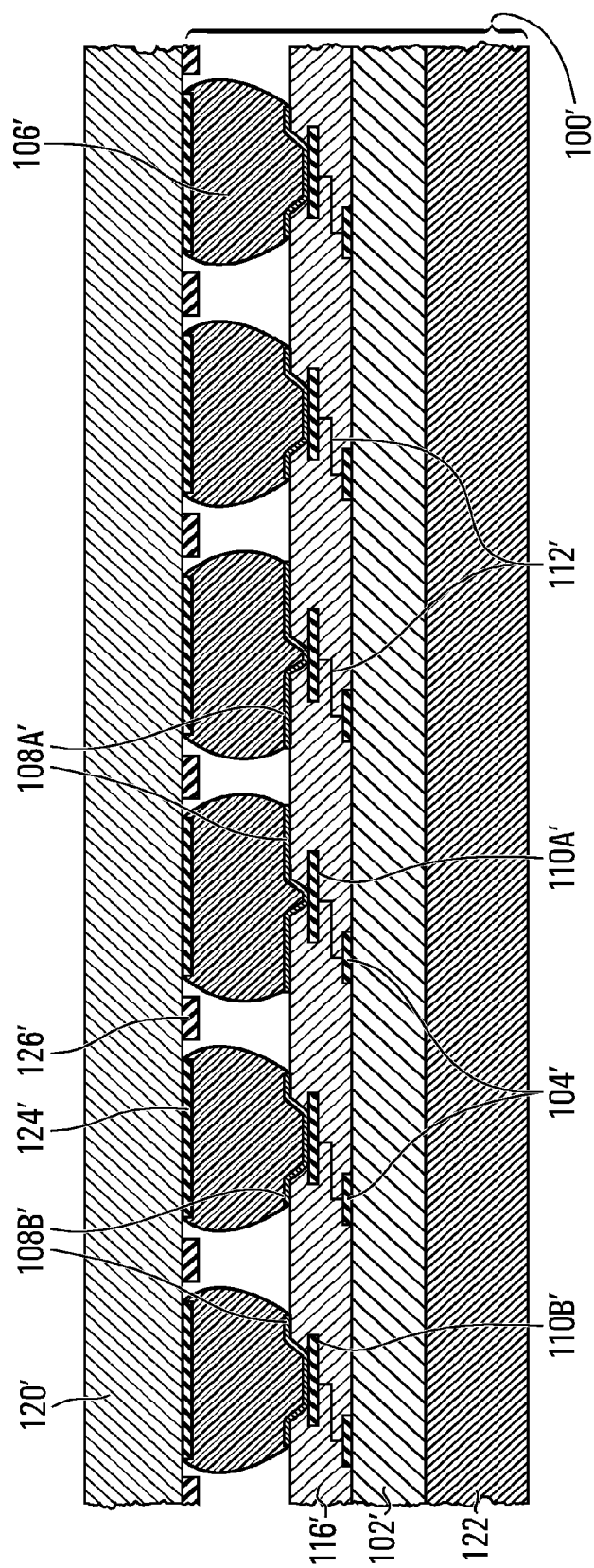
FIG. 4 is a cross sectional view of the semiconductor chip package of FIG. 3 taken along line IV-IV.
Figure 5:
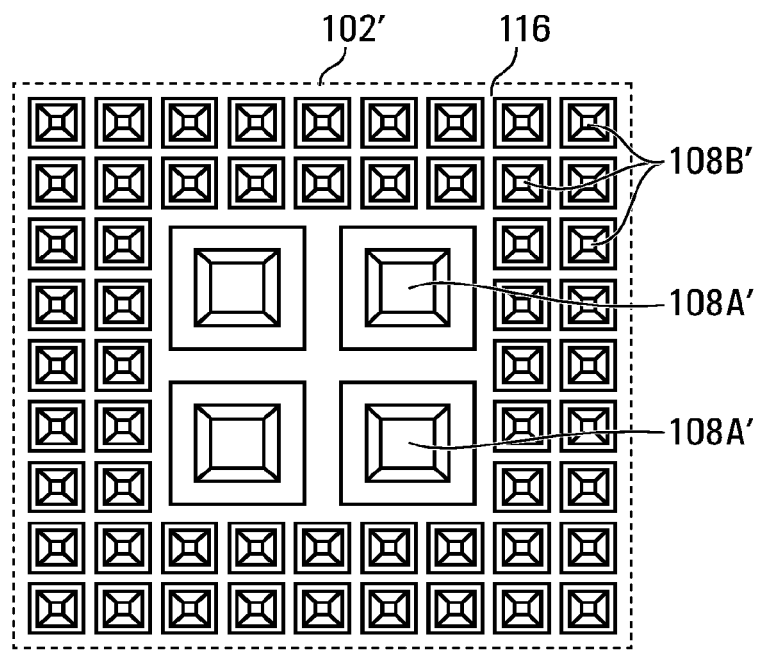
FIG. 5 is a schematic diagram of UBM pads used in the semiconductor chip package of FIG. 3.

As depicted in FIGS. 3-4, semiconductor package 100' includes a die 102' having an active surface 102A' and an inactive surface 102B'. Die 102' also contains an integrated circuit formed on or proximate its active surface 102A'. Die pads 104' on active surface 102A' of die 102' provide signal interfaces to the integrated circuit.

Semiconductor chip package 100' may be a wafer level package formed using a wafer level fabrication method exemplary of an embodiment of the present invention. A protective layer (not shown) made of one or more layer of dielectric materials, polymer, or rubber may be used to protect the die 102' from mechanical damage.

A stiffener 122 may be attached to an inactive surface 102B' of die 102' by an adhesive. Stiffener 122 helps to reduce CTE mismatch between die 102' and board 120'. Board 120' may contain copper pads 124' and a solder mask.

Die 102' may be designed with fine pitch peripheral die pads 104'. A conductive routing 112', such as thin-film metal, may be used to interconnect die pads 104' to I/O pads 110'. Conductive routing 112' may be deposited using standard photolithography and thin film deposition techniques. A compliant layer 116' may be used to increase the stress compliance of under-bump metallization (UBM) pads 108' and solder bumps 106' formed thereon. Compliant layer 116' thus forms the front surface of package 100' (containing UBM pads 108' and solder bumps 106') while stiffener 122 forms the back surface of package 100'.

As shown in FIG. 4, UBM pads 108' are formed on I/O pads 110' to provide a low resistance electrical connection to solder bumps 106'. Solder bumps 106' may in turn be used to connect die 102' to a board 120', which may be a carrier substrate, or an application printed circuit board (PCB). When die 102' is attached to board 120', solder bumps 106' thus provide both the mechanical and electrical interconnection to copper pads 124'. UBM pads 108' may have one of at least two different sizes. In one embodiment, UBM pads 108' may include large UBM pads 108A' and small UBM pads 108B' (collectively UBM pads 108'). Large UBM pads 108A' may be formed in the interior (near the center of the front surface) of package 100' while smaller UBM pads 108B' may be formed near the periphery.

UBM pads 108' may be substantially rectangular or square in shape. These substantially rectangular UBM pads 108' may however, have rounded corner edges to reduce the effects of acute thermo-mechanical stress at the corners. As will become apparent, rectangular UBM pads 108' offer greater surface area for forming solder bumps 106' than their corresponding circular counterpart in conventional package 100.

I/O pads 110' may be uniform or alternately may have different sizes. For example, I/O pads 110' may optionally include larger I/O pads 110A' (corresponding to UBM pads 108A') and smaller I/O pads 110B' (corresponding to UBM pads 108B') as shown in FIG. 4.

Figure 6:
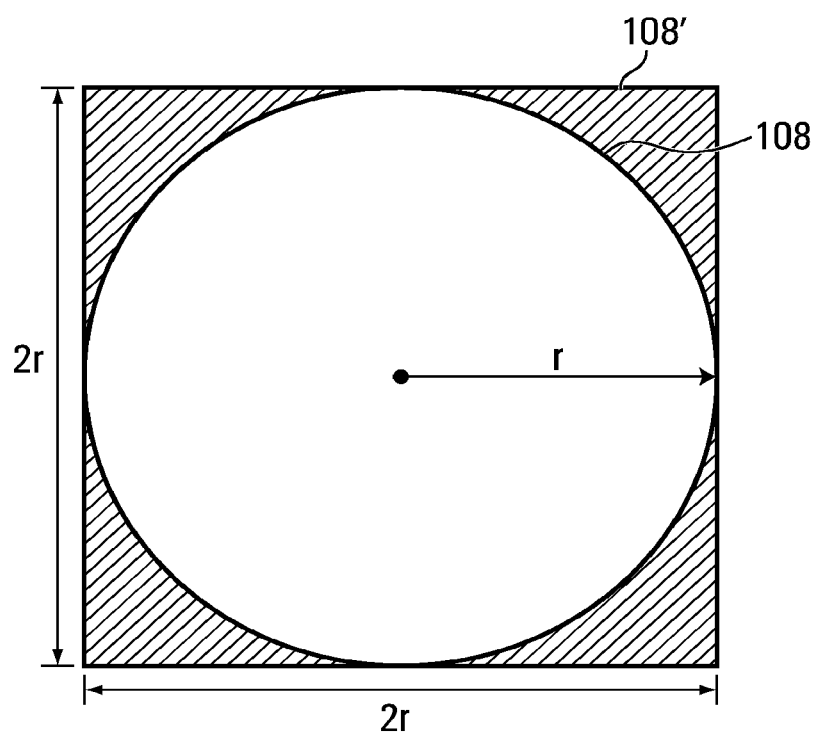
FIG. 6 is a schematic diagram comparing the relative sizes of a conventional UBM pad to an exemplary UBM pad used in the semiconductor chip package of FIG. 3.

UBM pad 108', used in exemplary embodiments of the present invention, and conventional circular UBM pad 108, are shown together in FIG. 6. As depicted, a circular UBM pad 108 of radius r has a surface area which is less than the surface area of corresponding UBM pad 108'. The shaded portions represent the extra surface area afforded by the use of square UBM pad 108'. As will become apparent, UBM pad 108 and UBM pad 108' may be slightly pitted or recessed in the middle, so that their respective surface on which a solder bump may be formed is not perfectly planar or flat. However, as may be appreciated, the recessed surfaces of UBM pads 108 and 108' are approximately the same for a given r (FIG. 6). Variations of rectangular UBM pads 108' may even have the same circular recessed portions as conventional UBM pads 108—in which case the recessed surfaces of UBM pads 108 and 108' are indeed exactly the same. In either case, the extra surface area of UBM pad 108', available for contact with a solder bump, may thus be computed by simply taking the difference of the area of the square (UBM pad 108') and the circle (UBM pad 108) as $(2r)^2 - \pi r^2 = (4-\pi)r^2$. This amounts to about a 27.3% increase in area achieved by using square pads. Rectangular UBM pads 108' used in exemplary embodiments of the present invention thus provide a larger surface area without compromising the I/O density or pitch of UBM pads in the package.

Figure 7:
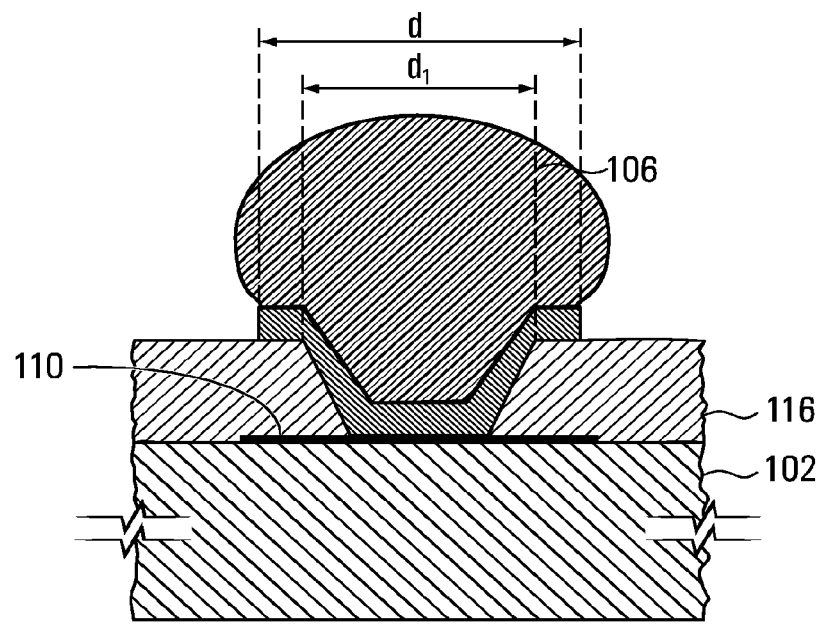
FIG. 7 is a cross sectional view of a conventional solder bump.
Figure 8:
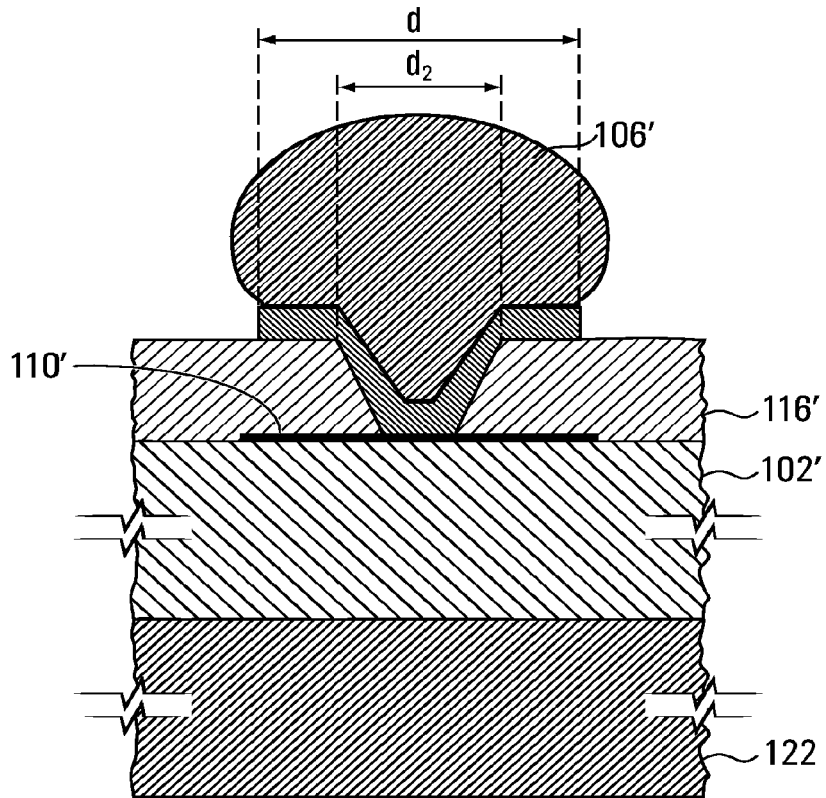
FIG. 8 is an enlarged cross sectional view of a solder bump in the semiconductor chip package of FIG. 3 taken along line VIII.

FIGS. 7-8 depict cross sectional views of a solder bump and a corresponding UBM pad. In particular, FIG. 7 depicts a cross sectional view of a conventional solder bump 106 and UBM pad 108 while FIG. 8 shows is an enlarged cross sectional view of solder bump 106' formed on UBM pad 108' exemplary of an embodiment of the present invention.

As shown (FIG. 7), the area of UBM pad 108 directly in contact with a corresponding circular I/O pad 110 is about $\pi(d_1/2)^2$ while the area of a circular UBM pad 108 that is directly in contact with the top of compliant layer 116 is about $\pi[(d/2)^2 - (d_1/2)^2]$. This is because conventional UBM pads 108 are circular. However, the area of UBM pad 108' directly in contact with the top of a compliant layer 116' is about $d^2 - \pi(d_2/2)^2$.

Figure 9:
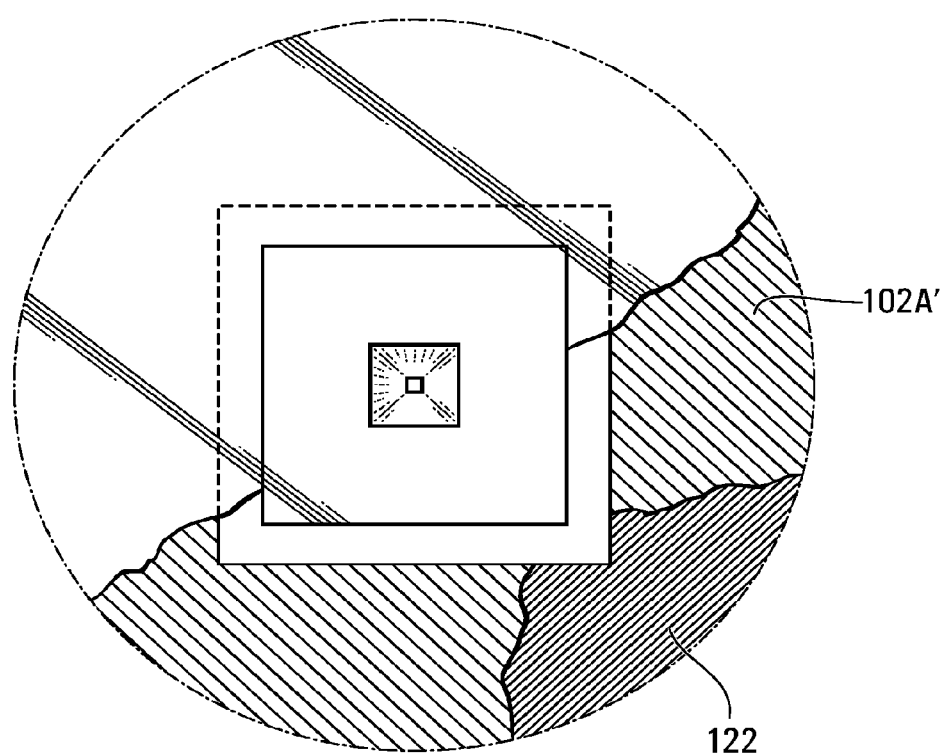
FIG. 9 is an enlarged plan view of a UBM pad in area IX of FIG. 3.

The length $d_2$ may be 10%-80% smaller than $d_1$ to allow solder bumps 106' to withstand greater mechanical or thermo-mechanical stress than conventional solder bumps 106. A greater surface area of contact between compliant layer 116 (or 116') and UBM pad 108 (or 108') leads to increased stability of solder bump 106 (or 106') respectively. FIG. 9 further depicts a top view of UBM pads 108' to show the area of support provided to solder bumps.

Die 102' may be formed from a thinned wafer. FIG. 10 depicts the steps in a fabrication process S1000 of a WLP such as semiconductor package 100'. The resulting partial-packages are depicted in FIGS. 11A-11F. Thus for each of steps S1002, S1004, S1006, S1008, S1010, and S1012, a corresponding intermediate partial package is as depicted in FIGS. 11A, 11B, 11C, 11D, 11E, and 11F respectively.

In initial step S1002 a finished wafer with integrated circuits formed on its active side or active surface is received. The initial wafer 102" (FIG. 11A) may be approximately 300 µm-400 µm in thickness.

In step S1004 wafer 102" is thinned. Thinning may be performed by grinding the inactive side of wafer 102" resulting in thinned wafer 102" (FIG. 11B). Wafer 102" may be approximately 50 µm in thickness after thinning. The exact thickness of die 102' may of course vary. In some alternate embodiments, the required wafer thickness may be high enough to make grinding unnecessary.

In step S1006, a stiffener 122" is attached to thinned wafer 102" (FIG. 11C). Stiffener material 122" may be attached to inactive surface of thinned wafer 102" using any suitable adhesive. Stiffener material 122" may be an organic material, a metallic material, an alloy, or another suitable material. In addition, stiffener material 122" should provide mechanical strength, electrical insulation and good adhesive properties. In addition stiffener material 122" may be chosen to have a CTE close the CTE of a board such as board 120 to which the package is to be attached.

Stiffener material 122" may also allow better handling of thinned wafer 102" during manufacturing as well as provide a robust surface for laser marking. Specific materials usable as stiffener material 122" include flame resistant (FR) epoxy resins reinforced with woven glass such as FR-4 and FR-5. The thickness of stiffener material 122" may range from 0.2 millimeters to 2.0 millimeters.

Stiffener material 122" may cover the entire inactive surface of thinned wafer 102" or may be patterned to cover the finished semiconductor package 100', or a portion thereof. For example, stiffener material 122" may be patterned to extend along the periphery of the finished semiconductor package (such as package 100').

The adhesive used to attach stiffener material 122" should be compatible with both stiffener material 122" and thinned wafer 102". Attachment of stiffener 122" may be achieved with a film adhesive or printable paste. Examples of suitable adhesive materials include a film epoxy used for manufacture of packages with stacked dies.

As noted, UBM pads associated with each integrated circuit formed on thinned wafer 102" may be rectangular or substantially rectangular in shape. In alternate embodiments, not all UBM pads need to be rectangular—that is, they may be a mixture of rectangular and other shapes (e.g., circular, polygonal etc.)

In step S1008, a compliant layer 116" (FIG. 11D), a redistribution layer (RDL) and UBM pads are formed. RDL is used to reroute die pads to corresponding I/O pads. In addition, a UBM pad is formed on each I/O pad of each integrated circuit on wafer 102" to provide added stability and reliability to solder bumps. The resulting partial package is depicted in FIG. 11D. Each UBM pad formed on an I/O pad may include several sub-layers such as an adhesion sub-layer, a diffusion barrier sub-layer, a solder wettable sub-layer and an optional oxidation barrier. Formation of UBM pads may include cleaning, insulating oxide removal, and depositing metallurgy that makes good electrical and mechanical connection to a solder bump. The adhesion layer typically adheres to the metal of a die-pad or conductive trace in communication with a die pad (e.g., die pad 104'), and a surrounding compliant layer. Typical adhesion layer materials include chromium (Cr), titanium (Ti), nickel (Ni), tungsten (W) and zincate. The solder wettable sub-layer offers an easily wettable surface to the molten solder, for good bonding of solder bumps to the underlying metal. An optional oxidation barrier layer may prevent oxidation of the underlying layers.

In step S1010, solder bumps may be formed on UBM pads 108' to form a completed wafer level package (FIG. 11E) which may be separated into individual semiconductor package pieces.

Deposition of solder onto UBM pads 108' to form solder bumps 106' may be accomplished by electroplating, printing or evaporation. Printing involves the use of semi-liquid bumps which must be reflowed to become solid. In electroplating, the solder may be electroplated through a photo-resist mask to control the volume. Evaporation vaporizes a metal compound in a vacuum chamber, resulting in a uniform coating of the thinned die. Patterning may be achieved by using physical masks. Alternatively, sputtering involves directed metal ion plasma between an anode and a cathode using a target made from the metal to be deposited. Other processes that may be used are explained in detail in Harper, Charles A. 2005 *Electronic Packaging and Interconnection*, 4th ed. New York: McGraw Hill, the contents of which are hereby incorporated by reference.

In step S1012, completed wafer level package of FIG. 11E is singulated (i.e. separated into individual semiconductor packages) resulting in semiconductor package 100' (FIG. 11F, FIG. 3). Separation of the wafer level package into individual semiconductor packages may be accomplished by scribing and breaking, by mechanical sawing using a dicing saw, by laser cutting or any other suitable separation techniques known to those of ordinary skill in the art.

In alternate embodiments, UBM pads 108' may be formed directly on die pads 104' of die 102'. UBM pads formed directly on die pads are advantageous in some applications as they eliminate the need for conductive or metal rerouting. Such UBM pads formed directly on die pads may be used, for example in packaging some advanced processors, in which the die pads themselves are often already evenly distributed across the die, rather than being restricted to the perimeter.

In another alternate embodiment, stiffener 122 need not be attached to inactive surface 102B' of die 102' directly. Instead another layer or multiple layers such as glass or polymer or composite materials may be present between inactive surface 102B' and stiffener 122.

Advantageously, embodiments of the present invention may withstand greater thermo-mechanical stress (resulting, for example, from CTE mismatches) as solder bumps 106' formed on I/O pads 110' near the interior of die 102' provide strong electromechanical bonding of die 102' to board 120'. Consequently, smaller solder bumps near the periphery of die 102' may be subjected to reduced stress, as lager solder bumps 106' near the interior anchor die 102' firmly in place on board 120'. Consequently die 102' in package 100' may be 20%-40% larger. Advantageously, forming larger UBM pads near the center of die 102', while using smaller UBM pads near the periphery of die 102' makes routing die pads 104', to redistributed I/O pads 110' easier.

Semiconductor packages exemplary of embodiments of the present invention may be used to form electronic components such as graphics processors, dynamic random access memory (DRAM) chips, digital signal processors (DSPs), flash memory chips, general purpose processors and specialized ASICs. These may be used in a variety of end products including graphics cards, digital cameras and camcorders, cell phones, personal digital assistants (PDAs), memory cards, and the like.

In alternate embodiments, in addition or alternate to square and rectangular shapes, other polygonal shapes such as hexagonal, orthogonal and rhombic shapes may be used to form UBM pads 108'.

Of course, the above described embodiments, are intended to be illustrative only and in no way limiting. The described embodiments of carrying out the invention, are susceptible to many modifications of form, arrangement of parts, details and order of operation. The invention, rather, is intended to encompass all such modification within its scope, as defined by the claims.

What is claimed is:

1. A method of manufacturing semiconductor package from a wafer having at least one integrated circuit (IC) formed on an active surface, said method comprising:
    a) attaching a stiffener to an inactive surface of said wafer;
    b) forming substantially rectangular under bump metallization (UBM) pads, each one of said UBM pads in communication with said IC, said UBM pads comprising at least a first UBM pad, and a second UBM pad larger than said first UBM pad, wherein said first UBM pad is formed near a periphery of said semiconductor chip package;
    c) forming solder bumps extending from each of said UBM pads; and
    d) separating said wafer into semiconductor packages.

2. The method of claim 1, further comprising forming a compliant layer on said active surface of said wafer prior to said forming said UBM pads.

3. The method of claim 2, wherein said compliant layer comprises a dielectric material.

4. The method of claim 2, further comprising forming conductive rerouting to interconnect each of a plurality of die pads corresponding to each IC, to a corresponding one of a plurality of input-output (I/O) pads on said compliant layer, wherein each of said UBM pads is formed on a corresponding one of said I/O pads.

5. The method of claim 1, further comprising thinning said wafer by grinding, prior to said attaching said stiffener.

6. The method of claim 1, wherein said second UBM pad is formed near a center of said semiconductor chip package.

7. The method of claim 1, wherein said stiffener is made of one of organic and metallic materials.

8. The method of claim 1, wherein said UBM pads comprise:
    at least a first plurality of said UBM pads of a first size placed near a center of said active side spaced apart at a first pitch, and a second plurality of said UBM pads of a second size smaller than said first size and spaced apart at a second pitch, placed near a periphery of said active side.

9. A method of manufacturing semiconductor package from a wafer having at least one integrated circuit (IC) formed on an active surface, said method comprising:
    a) attaching a stiffener to an inactive surface of said wafer;
    b) forming a first plurality of UBM pads of a first size placed near a center of said active side spaced apart at a first pitch, and a second plurality of said UBM pads of a second size smaller than said first size and spaced apart at a second pitch, placed near a periphery of said active side;
    c) forming solder bumps extending from at least some of said UBM pads; and
    d) separating said wafer into semiconductor packages.

10. A method of manufacturing semiconductor package from a wafer having at least one integrated circuit (IC) formed on an active surface, said method comprising:
   a) attaching a stiffener to an inactive surface of said wafer;
   b) forming substantially rectangular under bump metallization (UBM) pads, each one of said UBM pads in communication with said IC, said UBM pads comprising at least a first UBM pad, and a second UBM pad larger than said first UBM pad, wherein said second UBM pad is formed near a center of said semiconductor chip package;
   c) forming solder bumps extending from each of said UBM pads; and
   d) separating said wafer into semiconductor packages.

11. The method of claim 10, wherein said UBM pads comprise:
   at least a first plurality of said UBM pads of a first size placed near a center of said active side spaced apart at a first pitch, and a second plurality of said UBM pads of a second size smaller than said first size and spaced apart at a second pitch, placed near a periphery of said active side.

\* \* \* \* \*